US008531839B2

(12) United States Patent  
Iyengar et al.

(10) Patent No.: US 8,531,839 B2
(45) Date of Patent: Sep. 10, 2013

(54) LIQUID COOLED DATA CENTER WITH ALTERNATING COOLANT SUPPLY LINES

(75) Inventors: Madhusudan K. Iyengar, Woodstock, NY (US); Roger R. Schmidt, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 258 days.

(21) Appl. No.: 12/916,434

(22) Filed: Oct. 29, 2010

(65) Prior Publication Data

US 2012/0103566 A1     May 3, 2012

(51) Int. Cl.
*H05K 7/20* (2006.01)
*H01L 23/34* (2006.01)

(52) U.S. Cl.
USPC ...... 361/699; 361/679.53; 361/724; 361/698; 257/714

(58) Field of Classification Search
USPC ............... 361/699, 724–727, 679.46, 679.53; 165/80.4–80.5, 104.33; 257/714
See application file for complete search history.

(56) References Cited

U.S. PATENT DOCUMENTS

| 6,775,137 | B2 | 8/2004 | Chu et al. | 361/696 |
| 7,106,590 | B2 * | 9/2006 | Chu et al. | 361/701 |
| 7,342,789 | B2 | 3/2008 | Hall et al. | 361/701 |
| 7,477,514 | B2 * | 1/2009 | Campbell et al. | 361/699 |
| 7,486,513 | B2 | 2/2009 | Hall et al. | 361/699 |
| 7,644,051 | B1 * | 1/2010 | Moore et al. | 706/21 |
| 7,724,518 | B1 * | 5/2010 | Carlson et al. | 361/679.53 |
| 2008/0212282 | A1 | 9/2008 | Hall et al. | 361/701 |
| 2009/0225514 | A1 | 9/2009 | Correa et al. | 361/701 |

FOREIGN PATENT DOCUMENTS

| EP | 2053911 A2 | 4/2009 |
| EP | 2152054 A2 | 2/2010 |
| WO | WO 2004/051445 A1 | 6/2004 |

* cited by examiner

*Primary Examiner* — Zachary M Pape
(74) *Attorney, Agent, or Firm* — Dennis Jung; Ido Tuchman

(57) ABSTRACT

Methods of preventing overheating of computer equipment in a cabinet when a supply coolant to a cooler in the cabinet fails. An example embodiment is a data center that includes a plurality of cabinets and at least two coolant supply lines. The cabinets are configured to house computer equipment and the coolant supply lines provide coolant for the cabinets. Moreover, the cabinets are arranged in at least one row of adjacent cabinets such that each row of adjacent cabinets receives coolant from alternating coolant supply lines.

15 Claims, 4 Drawing Sheets

LIQUID COOLED DATA CENTER WITH ALTERNATING COOLANT SUPPLY LINES

BACKGROUND

The present invention relates to data centers, and more specifically to data centers employing alternating coolant supply lines along cabinet rows.

The American Society of Heating, Refrigerating and Air-Conditioning Engineers (ASHRAE) currently recommends that the temperature of air entering a server rack should be between 18° C. to 27° C. However, the inlet air temperature may reach up to 32° C. for short periods of time without adverse consequences.

A rear door heat exchanger (RDHx) cools exhaust air from a server rack at the rack's rear door. Coolant (i.e., chilled water) from a coolant distribution unit (CDU) enters the RDHx and is heated by the rack's exhaust air. Thus, heat from the exhaust air is transferred to the coolant. The heated coolant leaves the RDHx and returns to the CDU, where it is once again cooled. The CDU acts as a buffer between the coolant circulating in the data center and coolant used by a chiller plant.

Failure of a coolant supply line due, for example, to a coolant leak requires shutting a valve supplying coolant to the supply line. Such a failure typically results in one or more rack rows not cooling the exhaust air. In a conventional arrangement of coolant supply, a temporary coolant supply line shutdown may cause localized inlet air temperature to quickly increase beyond 32° C. Such a temperature rise may require shutdown of the electronic equipment in the rack to prevent overheating.

SUMMARY

One exemplary aspect of the invention is a data center that includes a plurality of cabinets and at least two coolant supply lines. The cabinets are configured to house computer equipment and the coolant supply lines provide coolant for the cabinets. Moreover, the cabinets are arranged in at least one row of adjacent cabinets such that each row of adjacent cabinets receives coolant from alternating coolant supply lines.

Another exemplary aspect of the invention is a method of preventing overheating of computer equipment in a cabinet when a coolant to a cooler in the cabinet fails. The method includes positioning cabinets in a data center such that at least one row of adjacent cabinets receive coolant from alternating supply lines of the coolant. Each of the supply lines provides the coolant to a plurality of cabinets.

Yet another exemplary method of preventing overheating of computer equipment in a cabinet when a supply coolant to a cooler in the cabinet fails includes simulating a positioning of cabinets in a data center such that a row of cabinets receive coolant from alternating supply lines of the coolant. The method further includes calculating a temperature elevation due to a supply line failure for a time interval.

DETAILED DESCRIPTION

The present invention is described with reference to embodiments of the invention. Throughout the description of the invention reference is made to FIGS. 1-4.

As discussed in detail below, embodiments of the present invention can help maintain uniform air temperature in data centers zones when a coolant supply line to a plurality of cabinets fails. Embodiments of the invention can therefore help keep a data center running while the failed supply line is serviced.

Figure 1:
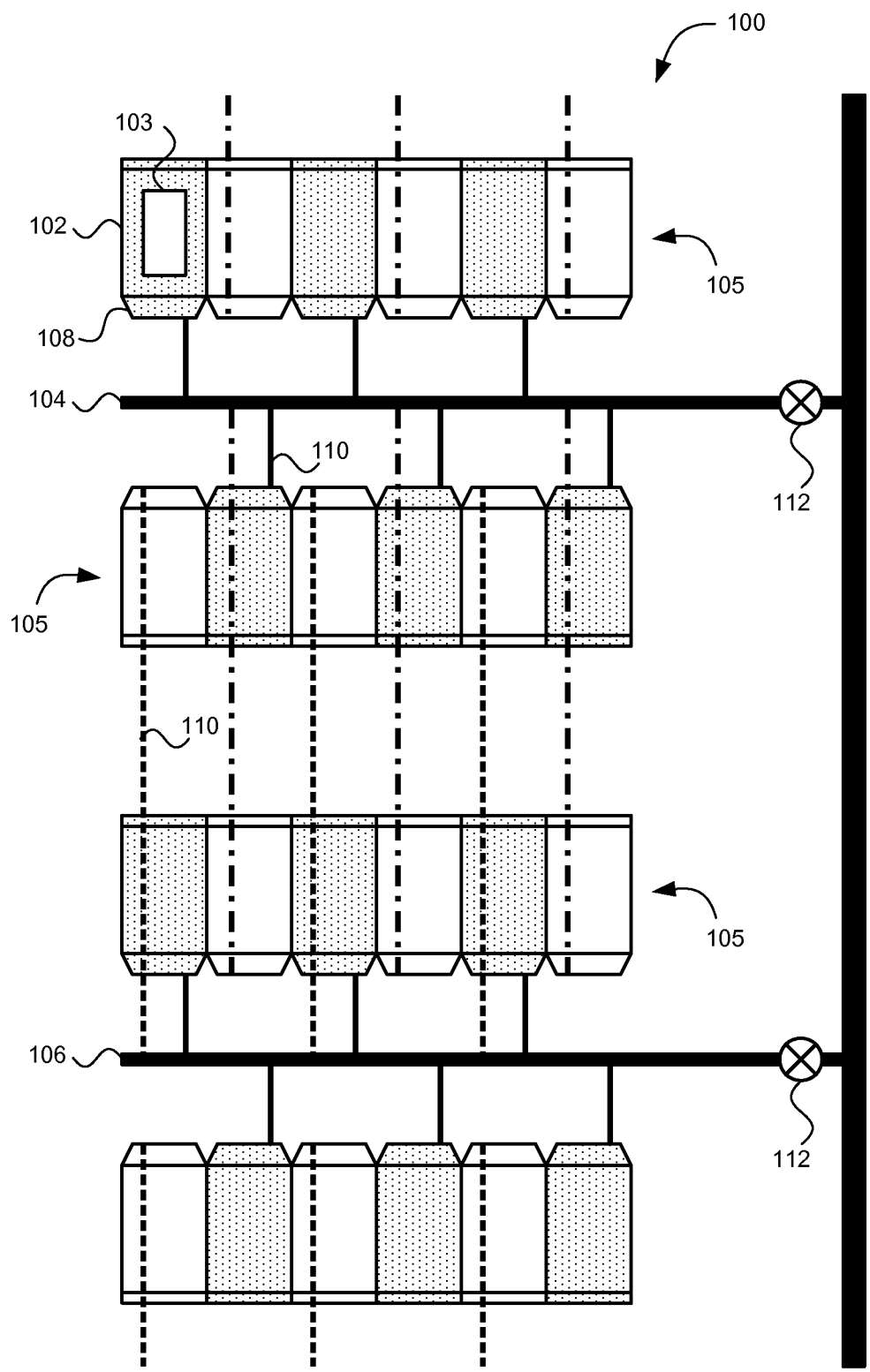
FIG. 1 shows a plan view of an example data center in accordance with the present invention.

FIG. 1 shows plan view of an example data center 100 contemplated by the present invention. The data center 100 includes a plurality of cabinets 102 (also referred to herein as server cabinets, racks and server racks). The cabinets are configured to house computer equipment 103. Furthermore, the data center 100 includes coolant supplied from at least two coolant supply lines 104 and 106. Each coolant supply line 104 and 106 includes two pipes: a coolant supply pipe and a coolant return pipe. As shown, the cabinets 102 are arranged in rows 105 of adjacent cabinets. Each row of cabinets 105 receives coolant from alternating coolant supply lines 104 and 106. Each cabinet 102 receives coolant through a feeder line 110 from one of the supply lines 104 and 106. In the embodiment shown in FIG. 1, the supply lines 104 and 106 originate from a master line. However, it is contemplated that in other embodiments the supply lines 104 and 106 originate from one or more coolant distribution units (CDUs).

In the example data center 100, of each of the cabinets 102 includes a cooler 108 for cooling inlet air to the cabinet. The cooler 108 may be a rear door heat exchanger (RDHx) and the supply coolant may be a liquid. RDHx feeder lines 110 from a coolant supply line 104 and 106 are staggered to different rack rows 105 such that a failure in one of the coolant supply line does not result in a cooling failure along an entire row of adjacent racks. By staggering the coolant feeder lines 110, adjacent RDHxs can pick up the heat load and continue to cool a rack zone affected by a coolant supply line shutdown.

In one embodiment of the invention, coolant supply lines 104 and 106 are configured to provide coolant to RDHxs in an alternating or checkerboard pattern. Using this configuration, if any single supply line fails, every other RDHx in a row of racks would stop cooling. However, the RDHxs adjacent to the failing RDHxs would continue to function and could pick up the heat load. Thus, if there is a coolant leak requiring engagement of a shutoff valve 112 for one of the coolant supply lines 104 and 106, every other RDHx in a cabinet row 105 would stop functioning. However, the functioning RDHxs in the row 104 can pick up the heat load and continue to cool the rack zone containing the failing coolant supply line.

In various embodiments, the arrangement of the plurality of cabinets 102 may be modified. In one arrangement, side-by-side cabinets in the cabinet rows are coupled to different coolant supply lines 104 or 106. Another embodiment includes arranging the plurality of cabinets 102 such that the cabinets receive coolant from alternating coolant supply lines 104 and 106 in a checkerboard pattern. A further embodiment includes a cabinet arrangement wherein no adjacent cabinets of the plurality of cabinets 102 are coupled to the same coolant supply line 104 or 106 and cabinets diagonal to each other are coupled to the same coolant supply line 104 or 106.

Figure 2:
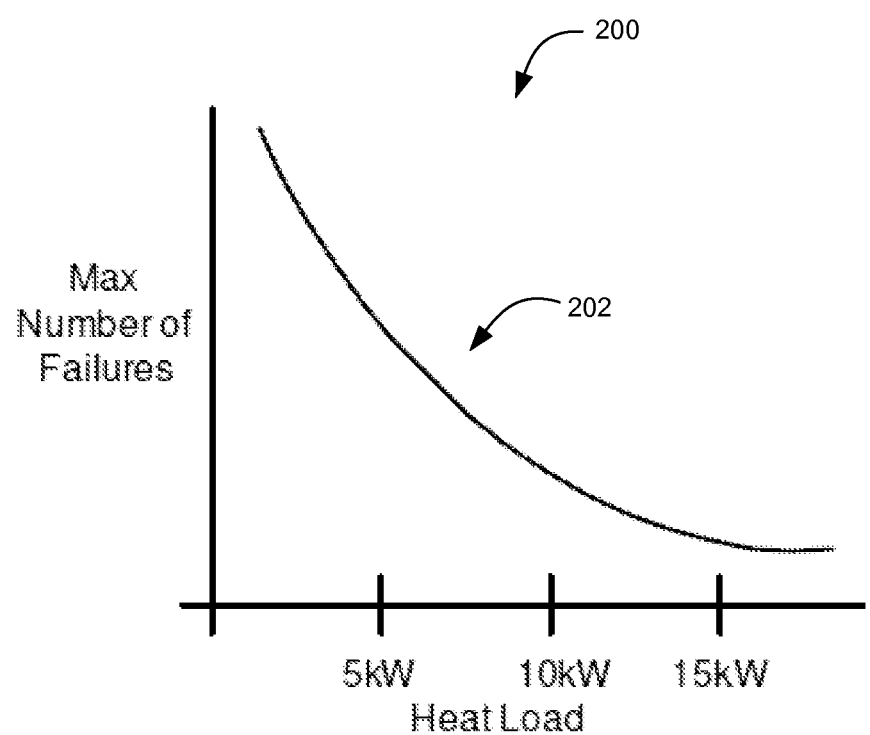
FIG. 2 is a graph illustrating the relationship between the maximum number of failing racks and rack heat load for homogeneous servers that may be acceptable in a data center.

Another embodiment involves arranging the cabinets 102 according to a heat load of the cabinets. The maximum number of acceptable failing cabinets in a row using the invention will depend on their heat load, as is illustrated in FIG. 2. The arrangement of the cabinets may be configured to maintain an inlet air temperature to the cabinets below 32° C. when one of the two coolant supply lines is shut down. Those skilled in the art will recognize that the example data center 100 could take on a wide variety of cabinet arrangements.

The maximum number of acceptable failing racks in a heat zone likely depends on rack heat load. Assuming homogeneous servers, an example relationship between the maximum number of acceptable failing racks and rack heat load is shown in FIG. 2. Thus, the exact configuration of the coolant supply line may vary according to the anticipated heat load of a zone.

Figure 3:
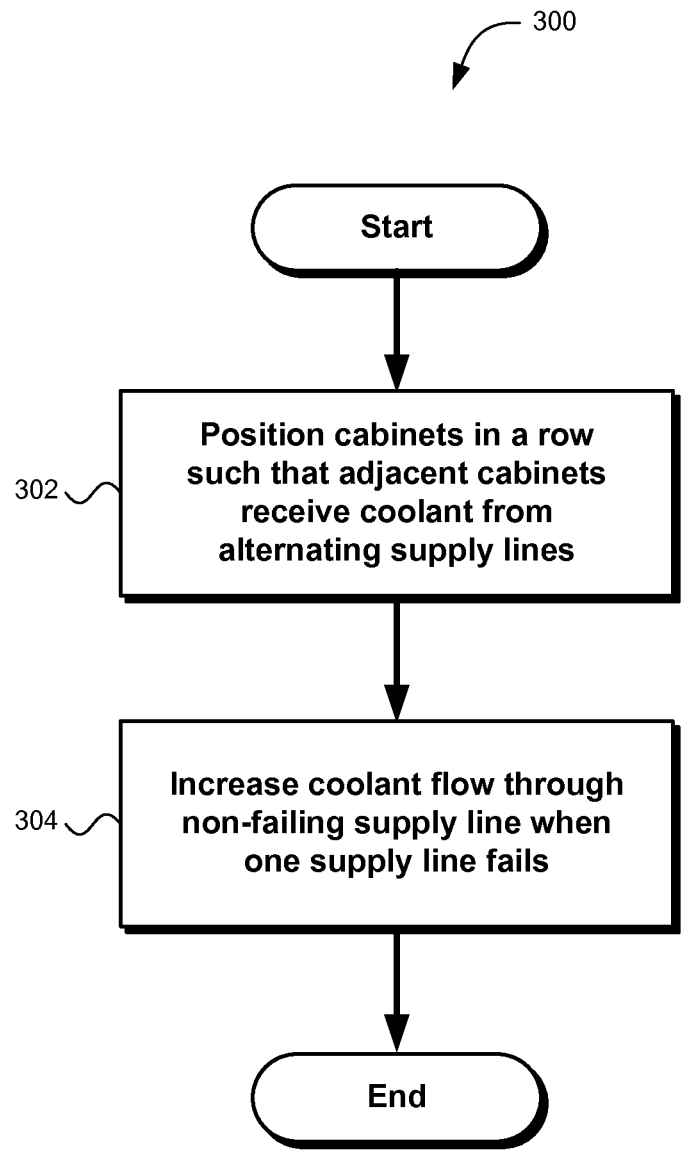
FIG. 3 shows a flowchart for an example method of preventing the overheating of computer equipment in a cabinet when a supply coolant to a cooler in the cabinet fails.

FIG. 3 shows a flowchart 300 for an example method of preventing the overheating of computer equipment in a cabinet when a supply coolant to a cooler in the cabinet fails. The method may include positioning operation 302. During this operation, cabinets in a data center are positioned such that at least one row of adjacent cabinets receives coolant from alternating supply lines of the coolant. The method may further include increasing operation 304. During this operation, a flow of the coolant through a non-failing supply line is increased when one of the supply lines fails.

It is contemplated that positioning operation 302 may comprise positioning the cabinets such that side-by-side cabinets in the row are coupled to different supply lines of the coolant. In another embodiment, the positioning operation 302 includes positioning the cabinets to receive coolant from the alternating coolant supply lines in a checkerboard pattern. Positioning operation 302 may include a cabinet positioning such that no adjacent cabinets are coupled to the same supply line and cabinets diagonal to each other are coupled to the same supply line.

Further still, the positioning operation 302 may include a cabinet positioning that is based, at least in part, on a heat load of the cabinets, illustrated in FIG. 2. Another embodiment includes positioning of the cabinets in order to maintain an inlet air temperature to the cabinets below 32° C. when one of the supply lines is shut down. The method 300 may include a supply coolant that is liquid, chilled water, or refrigerant. The method 300 may also include a cooler that is a rear door heat exchanger.

Figure 4:
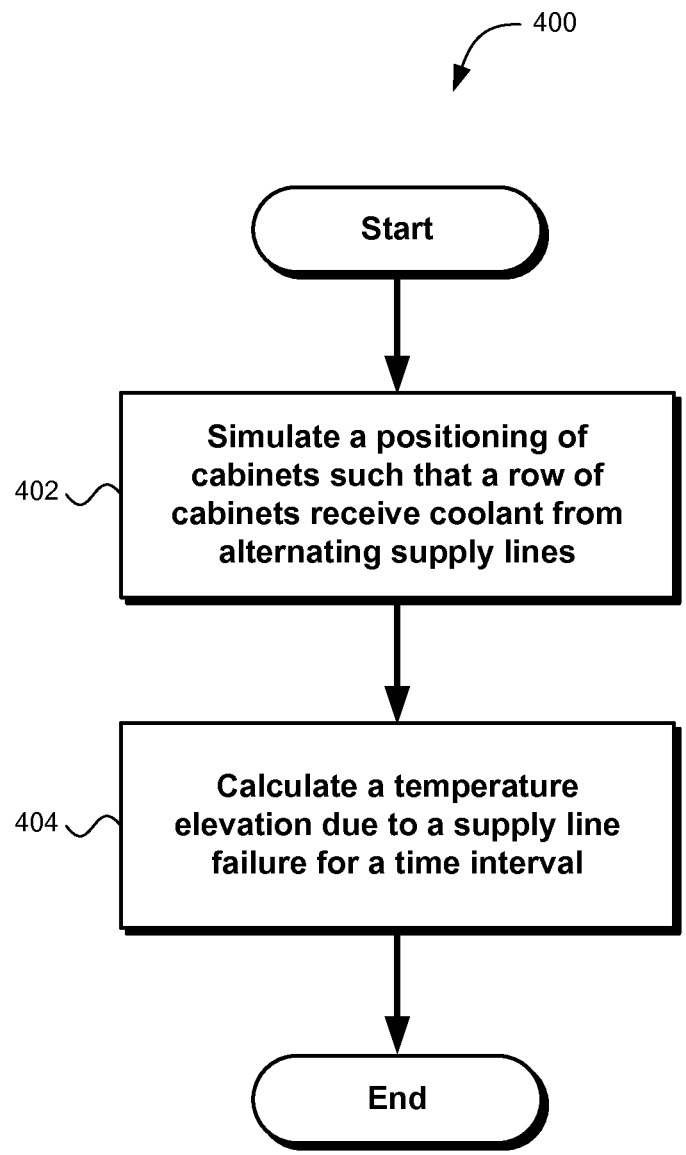
FIG. 4 shows a flowchart for an example method of preventing the overheating of computer equipment in a cabinet when a supply coolant to a cooler in a cabinet fails.

FIG. 4 shows a flowchart 400 for an example method of preventing the overheating of computer equipment in a cabinet when a supply coolant to a cooler in a cabinet fails. The method includes simulating operation 402. During this operation, a positioning of cabinets in a data center is simulated such that a row of cabinets receive coolant from alternating supply lines of the coolant. Next, at calculating operation 404, a temperature elevation due to a supply line failure for a time interval is calculated.

As will be appreciated by one skilled in the art, aspects of the invention may be embodied as a system, method or computer program product. Accordingly, aspects of the invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the C programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preferred embodiments to the invention have been described, it will be understood that those skilled in the art, both now and in the future, may make various improvements and enhancements that fall within the scope of the claims which follow. These claims should be construed to maintain the proper protection for the invention first described.

What is claimed is:

1. A data center comprising:
    a plurality of cabinets configured to house computer equipment; and
    at least two coolant supply lines from which the plurality of cabinets receive coolant; and
    wherein at least three cabinets of the plurality of cabinets are arranged in a row and receive coolant from alternating coolant supply lines;
    wherein the plurality of cabinets receives coolant from the alternating coolant supply lines in a checkerboard pattern; and
    wherein no adjacent cabinets of the plurality of cabinets are coupled to the same coolant supply line and at least some of the cabinets diagonal to each other are coupled to the same coolant supply line.

2. The data center of claim 1, wherein side-by-side cabinets in the row are coupled to a different one of the two coolant supply lines.

3. The data center of claim 1, wherein each of the plurality of cabinets includes a cooler for cooling inlet air to the cabinet.

4. The data center of claim 3, wherein the cooler is a rear door heat exchanger.

5. The data center of claim 1, wherein the positioning of the cabinets in the data center is determined according to a heat load of the cabinets.

6. The data center of claim 1, wherein the arrangement of the cabinets is configured to maintain an inlet air temperature to the cabinets below 32° C. when one of the at least two coolant supply lines is shut down.

7. The data center of claim 1, wherein the supply coolant is a liquid.

8. A method of preventing overheating of computer equipment in a cabinet when a coolant to a cooler in the cabinet fails, the method comprising:
    positioning cabinets in a data center such that at least one row of adjacent cabinets receive coolant from alternating supply lines of the coolant, each of the supply lines providing the coolant to a plurality of cabinets; and
    wherein at least three cabinets of the cabinets are arranged in a row and receive coolant from alternating coolant supply lines;
    wherein positioning the cabinets includes configuring the cabinets to receive the coolant from the alternating coolant supply lines in a checkerboard pattern; and
    wherein no adjacent cabinets are coupled to the same supply line and at least some of the cabinets diagonal to each other are coupled to the same supply line.

9. The method of claim 8, further comprising increasing a flow of the coolant through a non-failing supply line when one of the supply lines fails.

10. The method of claim 8, wherein the cooler is a rear door heat exchanger.

11. The method of claim 8, wherein positioning the cabinets includes configuring the cabinets such that side-by-side cabinets in the row are coupled to different supply lines of the coolant.

12. The method of claim 8, wherein the cabinet positioning is based, at least in part, on a heat load of the cabinets.

13. The method of claim 8, wherein the positioning of the cabinets is configured to maintain an inlet air temperature to the cabinets below 32° C. when one of the supply lines is shut down.

14. The method of claim 8, wherein the supply coolant is liquid.

15. The method of claim 14, wherein the liquid is chilled water.

* * * * *